United States Patent [19]

Osawa et al.

[11] Patent Number: 4,570,039
[45] Date of Patent: Feb. 11, 1986

[54] KEYSWITCH STRUCTURE

[75] Inventors: Hiroshi Osawa; Isao Kurashima; Yoshio Kawai, all of Tokyo, Japan

[73] Assignee: Casio Computer Co., Ltd., Tokyo, Japan

[21] Appl. No.: 633,135

[22] Filed: Jul. 23, 1984

[30] Foreign Application Priority Data

Jul. 30, 1983 [JP] Japan ................................. 58-139707

[51] Int. Cl.⁴ ............................................... H01H 3/12
[52] U.S. Cl. ................................... 200/5 A; 200/159 B
[58] Field of Search ............................ 200/5 A, 159 B

[56] References Cited

U.S. PATENT DOCUMENTS 4,018,999 4/1977 Robinson et al. ................... 200/5 A
4,231,098 10/1980 Tanimoto ............................ 200/5 A
4,334,134 6/1982 Janda .................................. 200/292

FOREIGN PATENT DOCUMENTS 57-4350 1/1982 Japan .
57-45631 10/1982 Japan .

Primary Examiner—J. R. Scott
Assistant Examiner—Morris Ginsburg
Attorney, Agent, or Firm—Frishauf, Holtz, Goodman & Woodward

[57] ABSTRACT

In a keyswitch structure, a number of recesses are formed in a lower case, and a projection with a flat top surface is formed inside each of the recesses. The recesses communicate with each other by means of grooves formed on the lower case, and fixed contacts are provided on the projections. A pattern is formed on the under surface of a flexible substrate put on the lower case so that movable contacts, included in the pattern, face the fixed contacts. An elastic sheet with a number of buttons is put on the flexible substrate, and the flexible substrate and the elastic sheet are fixedly held between an upper case and the lower case. When any of the buttons of the elastic sheet is pushed, the elastic sheet and the flexible substrate are elastically deformed to bring the movable contacts into contact with the fixed contacts.

10 Claims, 15 Drawing Figures

KEYSWITCH STRUCTURE

BACKGROUND OF THE INVENTION

The present invention relates to a keyswitch structure used for the key input of compact electronic computers, or calculators, etc.

Conventionally, a keyswitch used for the data input of a small electronic calculator has a construction as shown in FIG. 1, for example. In the keyswitch of this construction, the head portion of a key button 1 is inserted into a button hole 2a in an upper case 2 from the inside thereof and is prevented from slipping off by its collar portion 1a. The key button 1 is elastically held so that the collar portion 1a is brought into contact with the peripheral edge of the button hole 2a of the upper case 2 by a protruding portion 3a which protrudes upward from an elastic sheet 3 underlying the key button 1. A substrate 4 formed of a flexible film sheet and a circuit board 5 are arranged under the elastic sheet 3. A fixed contact 5a on the under surface of the substrate 4 and a movable contact 4a on the top surface of the circuit board 5 face each other with a spacer 6 between them. The spacer 6 has an opening 6a which corresponds in position to the key button 1. The elastic sheet 3, the substrate 4, the spacer 6, and the circuit board 5 are immovably fixed to retaining portions 2b of the upper case 2 by a lower case 7. If the key button 1 is pushed down, the protruding portion 3a is depressed, so that a push portion 3b inside of the protruding portion 3a forces down the substrate 4. As a result, the movable contact 4a is brought into touch with the fixed contact 5a of the circuit board 5 inside the opening 6a of the spacer 6, and an input signal is produced. When the key button 1 is released, the protruding portion 3a of the elastic sheet 3 is automatically restored to force up the key button 1; and the flexible substrate 4 is restored to its original flat form so that the movable contact 4a is separated from the fixed contact 5a. Thus, a key input operation is ended.

Constructed in this manner, the prior art keyswitch requires many components and is therefore low in production efficiency. Automatic assembly of so many sheetlike components using a vacuum system or other system would require large-scale equipment, resulting in a cost increase. Moreover, there are some restrictions on the manufacturing of an extra thin apparatus.

SUMMARY OF THE INVENTION

An object of the present invention is to provide a keyswitch structure capable of reducing the number of components used therein and improvement in production efficiency.

Another object of the invention is to provide a switch structure facilitating automatic assembly for lower cost, which is reduced in thickness.

According to the invention, there is provided a keyswitch structure comprising:

an elastic sheet member having a number of buttons to be pushed and capable of elastic deformation;

a flexible sheetlike substrate having one surface with which the buttons are brought into contact when the buttons are pushed to deform the elastic sheet member and the other surface, said sheetlike substrate being adapted to be elastically deformed when touched by the buttons;

a number of conductive patterns extending on the other surface of the sheetlike substrate and each having a movable contact portion at one end, said movable contact portions being separately arranged so as to be connected to contact regions on the other surface of the sheetlike substrate corresponding to those regions of the one surface with which the buttons are brought individually into contact;

a lower case having recesses individually facing the contact regions, said lower case being laminated with the sheetlike substrate and the elastic sheet member;

fixed contact portions provided individually in the recesses of the lower case, said fixed contact portions individually facing the movable contact portions so that the movable contact portions are brought into contact with their corresponding fixed contact portions to be connected thereby with one another when the buttons are pushed to deform the elastic sheet member; and fixing means for fixing the lower case, the sheetlike substrate, and the elastic sheet member.

DETAILED DESCRIPTION OF THE PREFERRED EMBODIMENTS

Figure 1:
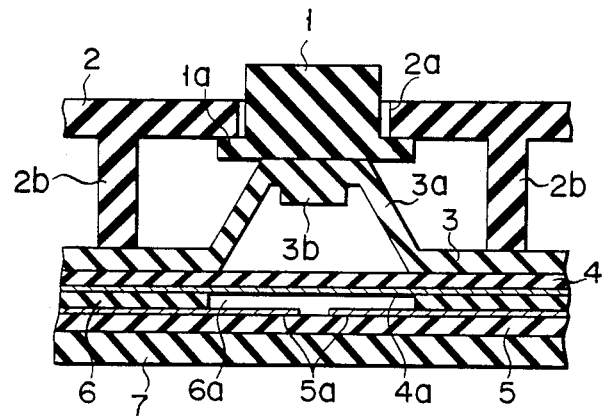
FIG. 1 is a sectional view showing a prior art keyswitch.
Figure 2:
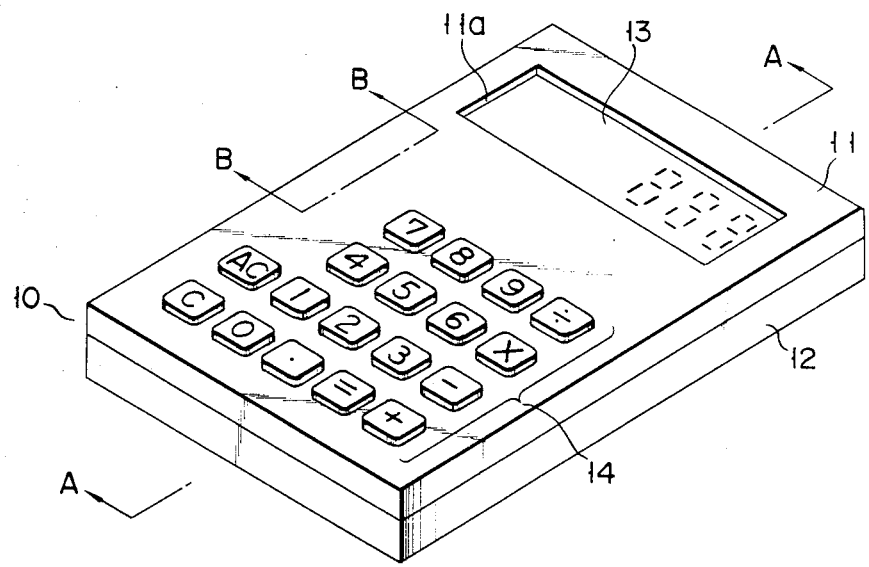
FIG. 2 is a perspective view of a compact electronic calculator provided with a keyswitch structure according to one embodiment of the present invention.

FIG. 2 is a perspective view of a compact electronic calculator which is provided with a keyswitch structure according to one embodiment of the present invention. As shown in FIG. 2, upper and lower cases 11 and 12 are assembled to form a case 10. A display unit 13 such as a liquid crystal device is received in the case 10. The display of the unit 13 can be observed through an opening 11a of the upper case 11. The head portions of key buttons 14 for the input operation project above the upper case 11 from the inside of the case 10. Dry cells (not shown in FIG. 2) for power supply, mentioned later, are set in the case 10, corresponding to the position indicated by line B—B of FIG. 2.

Figure 3:
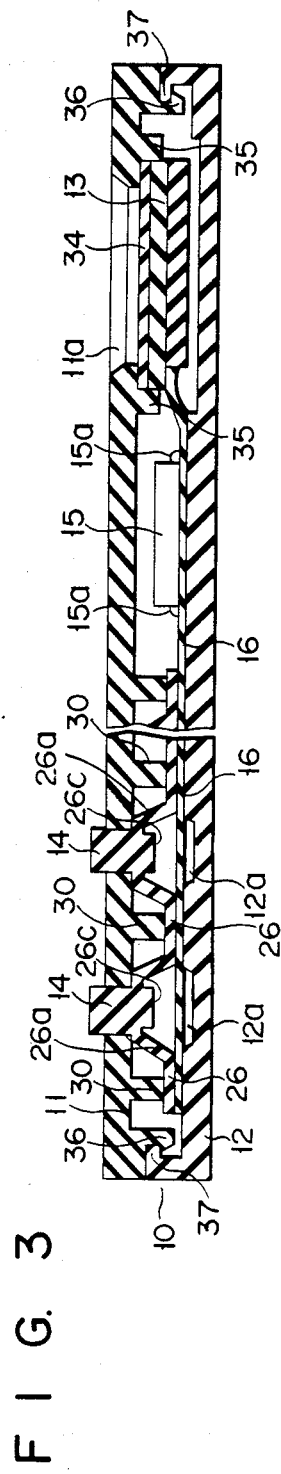
FIG. 3 is a sectional view taken along line A—A of FIG. 2.
Figure 4B:
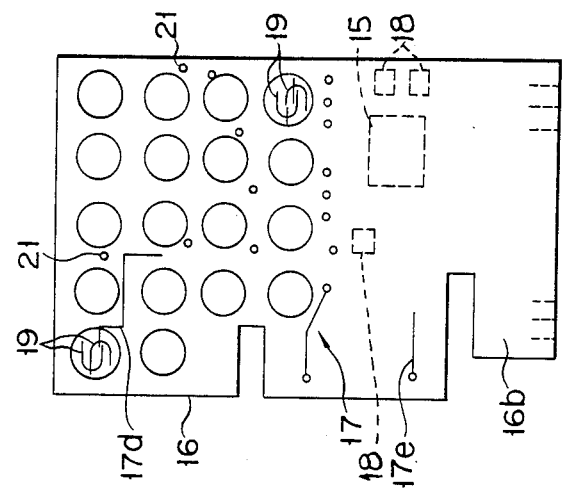
FIGS. 4A and 4B are plan views showing the front and rear sides, respectively, of a circuit board.
Figure 4A:
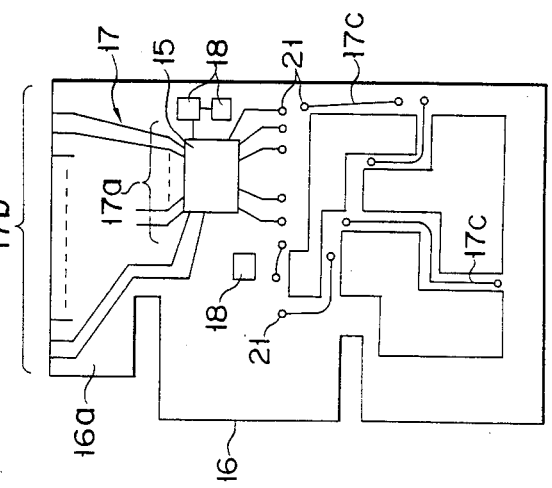
Figure 5A:
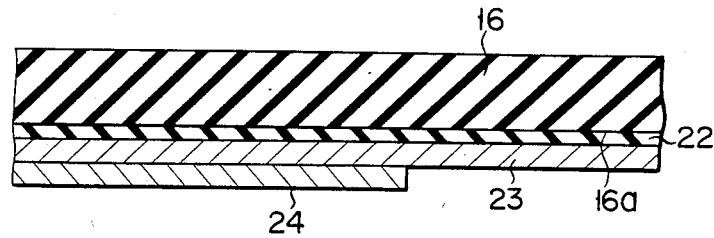
FIGS. 5A to 5D are sectional views for illustrating a method for manufacturing the circuit board.
Figure 5B:
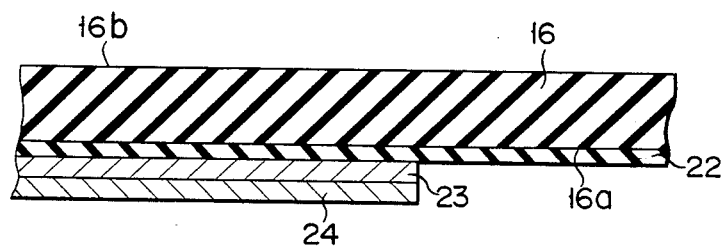
Figure 5C:
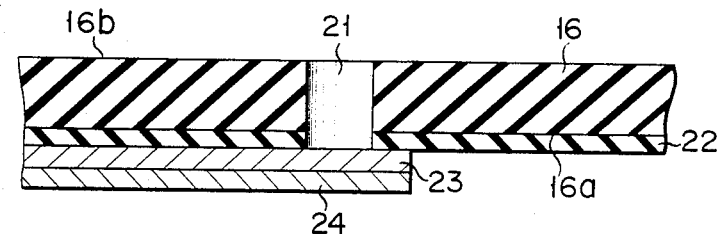
Figure 5D:
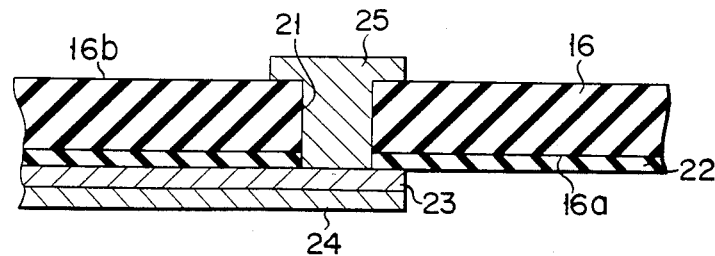

FIG. 3 is a sectional view taken along line A—A of FIG. 2. Besides the display unit 13 and the dry cells, an LSI 15 and other components are received in the case 10. As is generally known, the LSI 15 includes a memory circuit, arithmetic circuit, control circuit, etc., integrated with high density. The LSI 15 delivers timing pulses to a key matrix (not shown), executes computation in accordance with key input operation, and causes the display unit 13 to indicates input information and computation results. An input/output lead terminal 15a of the LSI 15 is connected to terminals of a circuit board 16 on which circuit patterns are formed. The circuit board 16 is a flexible member formed of polyester, polyimide, bismaleimide-triazine resin, or polysulfone film (glass epoxy). FIGS. 4A and 4B show circuit patterns arranged on both surfaces 16a and 16b of the circuit board 16, respectively. Patterns 17, including connecting terminals 17a connected to the LSI 15, connecting terminals 17b connected to electrode terminals (not shown) of the display unit 13, and connection patterns 17c, are arranged on one surface 16a of the circuit board 16. Chip elements 18, such as diode, capacitor, resistor, etc., like the LSI 15, are attached to the surface 16a of the circuit board 16 and have their electrode portions connected to the connecting terminals. Separated movable contacts 19 are arranged in a matrix configuration on the other surface 16b of the circuit board 16. The movable contacts 19 are formed in several circuits (not shown) with the connection patterns 17d. Numeral 17e designates a connection pattern connected to the dry cell. The circuit patterns 17 on the front and rear surface 16a and 16b of the circuit board 16 are connected via through holes 21. The circuit board 16 can be formed by a conventional method. Referring now to FIGS. 5A to 5D, a more efficient manufacturing method using a laser beam will be described. As shown in FIG. 5A, an aluminum foil 23 is bonded on the surface 16a of the flexible circuit board 16 by using an adhesive agent 22, and carbon ink 24 is applied to the aluminum foil 23 with a screen printing process, thereby forming circuit patterns. Then, the structure is etched to remove the exposed portion of the aluminum foil 23, as shown in FIG. 5B. Thereafter, a laser beam is applied to the other surface 16b of the circuit board 16 to form the through holes 21 therein, as shown in FIG. 5C. The laser beam, which evaporates the circuit board 16 and the adhesive agent 22 in a short time, is reflected by the aluminum foil 23. Therefore, the aluminum foil 23 will hardly be evaporated or melted by instantaneous irradiation. Thus, the aluminum foil 23 is exposed on the other surface 16b through the through hole 21. Then, the other surface 16b of the circuit board 16 is screen-printed by using carbon ink to form a circuit pattern 25, and the carbon ink is filled into the through hole 21 to form the printed circuit board, as shown in FIG. 5D.

The circuit board 16 thus completed is set in the case 10 so that the one surface 16a mounted with the LSI 15 faces upward and the other surface 16b with the movable contact 19 faces downward, as shown in FIG. 3. An elastic sheet 26 formed of silicone rubber or other insulating material is laid on the one surface 16a, and the lower case 12 is put directly on the other surface 16b, forming a three-layered structure.

Figure 6:
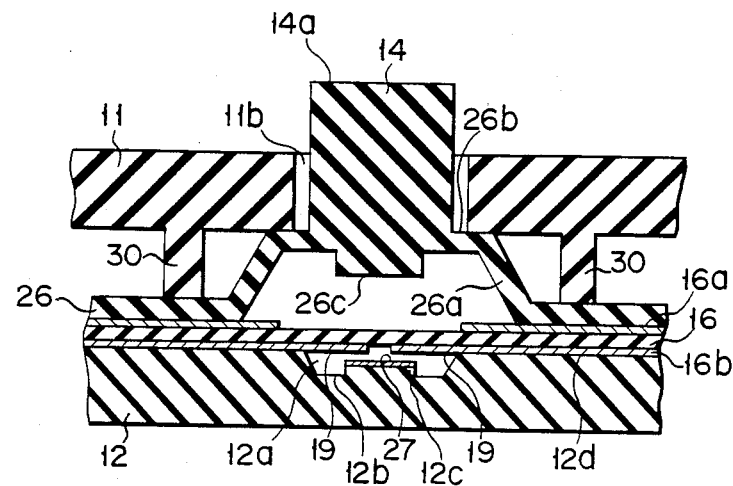
FIG. 6 is an enlarged sectional view showing the parts of a switch of FIG. 3 in cross-section
Figure 7:
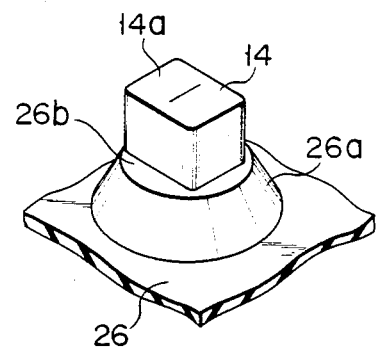
FIG. 7 is a partial enlarged perspective view of an elastic sheet.
Figure 8:
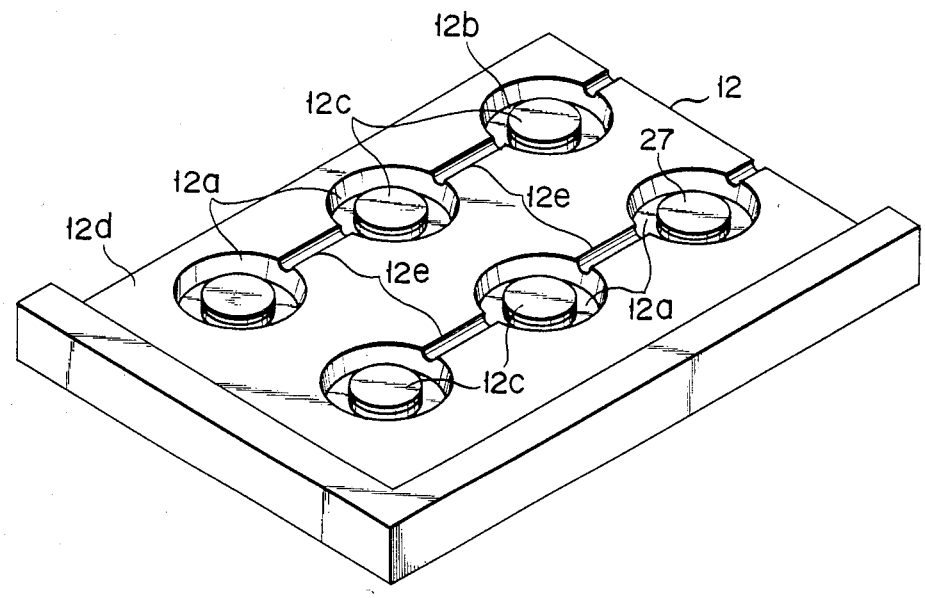
FIG. 8 is a partial enlarged perspective view of a lower case.
Figure 9:
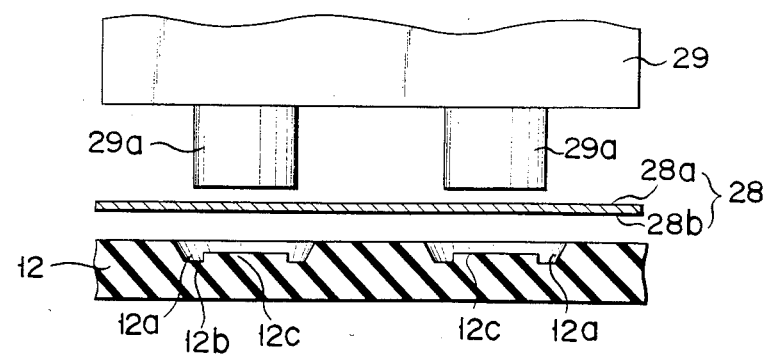
FIG. 9 is a sectional view showing a step of forming fixed contacts on the lower case.

FIG. 6 is an enlarged sectional view of the laminated structure composed of the elastic sheet 26, the circuit board 16, and the lower case 12. The protruding portions 26a are integrally formed with the elastic sheet 26 and are arranged to face the movable contacts 19. The protruding portions 26a which projects upward are provided with the key buttons respectively. Each of the key buttons 14 is projected outward from the protruding portions 26a through button holes 11b of the upper case 11. As shown in the perspective view of FIG. 7, the protruding portions 26a are each in the form of a truncated cone and the key buttons 14 of a rectangular prism. Each protruding portion 26a is coupled to its corresponding key button 14 at its head portion 26b. A key name is marked on the top surface 14a of each key button 14. The marking may be made by forming a recess or projection in or on the top surface 14a by printing or by fixing an indication sheet on the top surface 14a. Normally, the head portion 26b of the protruding portion 26 is elastically pressed against the inner peripheral edge of the button hole 11b of the upper case 11, so that the interior of the case 11 is screened from the outside by the case 10. A push portion 26c protrudes downward from the lower surface of the head portion 26b. The push portion 26c is also integrally formed on the elastic sheet 26. Recesses 12a, facing the movable contacts 19, are formed on a surface of the lower case 12 facing the other surface 16b of the circuit board 16. FIG. 8 is a partial perspective view of the lower case 12. Each recess 12a is a circular depression which faces the separated movable contacts 19 and a gap region between them. The central portion of the recess 12a slightly projects from its bottom surface 12b to form a flat step portion 12c. The step portion 12c should positively be located below the top surface of the lower case 12. A fixed contact 27 is formed on the flat step portion 12c. The fixed contact 27 may be fixed by printing using conductive ink, by vapor deposition of metal material, or by bonding metal foil. As a fixing method of higher efficiency, there is an aluminum foil transfer process which will now be described with reference to FIG. 9. A transfer film 28 is a well-known laminated structure which is obtained, for example, by coating or laminating a base film 28a with an aluminum foil or carbon layer 28b and using a separation layer as an interposition. The transfer film 28 is disposed so that the aluminum foil or carbon layer 28b faces the top surface 12d of the lower case 12. Pressure-bonding means 29 for forming the fixed contacts 27 includes pressure-bonding portions 29a arranged at the same pitches with the recesses 12a of the lower case 12. Each pressure-bonding portion 29a is in the form of a cylinder whose diameter is smaller than that of each recess 12a of the lower case 12 and greater than that of each flat step portion 12c. The length of the pressure-bonding portion 29a is sufficiently greater than the depth of the recess 12a. The pressure-bonding means 29 is held over the transfer film 28 so that the pressure-bonding portions 29a correspond individually to the step portions 12c of the lower case 12, and then it is moved down to heat-bond the transfer film 28 to the step portions 12c of the lower case, 12. As a result, a heat-bonding layer 28b is melted to transfer the aluminum foil to the step portions 12c. Thereafter, the base film 28a, along with the separation layer, is separated from the aluminum foil to form the fixed contact 27. In doing this, since each step portion 12c is somewhat raised above the bottom surface 12b of each recess 12a, only the step portions 12c are heated when the pressure-bonding means 29 is pressed against the structure. Thus, the aluminum foil can be uniformly transferred to the whole surface of each step portion 12c without separation at the peripheral edge portion. The fixed contacts 27 are located in predetermined positions of the lower case 12, that is, on the step portions 12c. The lower case 12 is provided with grooves 12e connecting the adjacent recesses 12a for circulating air between the recesses 12a. The grooves 12e introduce air into some recesses 12a from others so that the flexible circuit board 16 can securely be restored after it is depressed. Numeral 30 designates support portions which are formed integrally on the upper case 11 and hold the circuit board 16 over the lower case 12.

Figure 10:
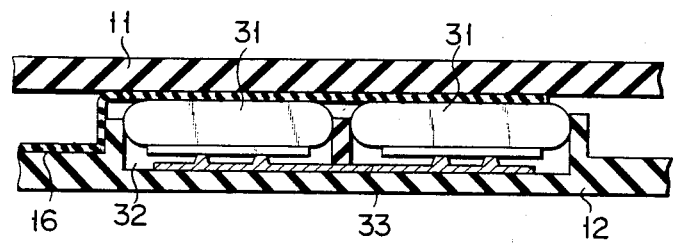
FIG. 10 is an enlarged sectional view taken along line B—B of FIG. 2.

FIG. 10 is a sectional view taken along line B—B of FIG. 2, showing a structure for housing power supply cells 31. The power supply cells 31 are lithium cells or silver oxide cells of a button type and are set in a receiving space 32 of the lower case 12. Provided on the bottom surface of the receiving space 32 is a terminal board 33 which touches one electrode of each power supply cell 31. The circuit board 16 is bent to extend over the receiving space 32 along the inside of the upper case 11. Thus, the connection pattern 17e on the rear surace 16b of the circuit board 16 is in contact with the other electrode of each power supply cells 31. As mentioned before, the connecting terminals 17b connected to the display unit 13 are arranged on the other surface 16a of the flexible circuit board 16 and are heat-bonded to the electrode terminals of the display unit 13 under pressure by using, e.g., a conductive adhesive agent of a hot-melt type. As shown in FIG. 3, a screen plate 34 defining a display region is put on the display unit 13, and the display unit 13 is held in position by a retaining member 35. The upper and lower cases 11 and 12 are combined by engaging a hook portion 36 and a projection 37. For higher assembly reliability, the upper and lower cases 11 and 12 may be coupled by screwing as required.

A method for assembling the aforementioned compact electronic calculator will now be described. The LSI 15 and the chip elements 18 are mounted on the circuit board 16 as a subassembly, and the display unit 13 is connected to the rear surface 16a of the circuit board 16. The fixed contacts 27 are fixed to the lower case 12. Also, the terminal board 33 is mounted on the bottom surface of the receiving space 32. Thereafter, the elastic sheet 26 is put on the upper case 11 held upside down, and the key buttons 14 are inserted into their corresponding button holes 11b. The screen plate 34 is fitted in the retaining member 35. As required, the screen plate 34 may be bonded to the inside of the upper case 11. Then, the combination of the circuit board 16 and the display unit 13 is set in place. The display unit 13 is fitted in the retaining member 35, and the circuit board 16 is set so that the movable contacts 19 are located under their corresponding key buttons 14. In doing this, that portion of the circuit board 16 to be connected to the power supply cells is disposed so as to extend along the inside of the upper case 11, corresponding to the receiving space 32. The power supply cells 31 are attached to the battery connection portion. Then, the lower case 12 is joined, and the hook portion 36 is locked to the projection 37. Thus, owing to the reduced number of components, the assembly is completed with ease. Also, the movable contacts 19 can be faced to the fixed contact 27 by only joining the circuit board 16 and the lower case 12 together. The compact electronic calculator thus assembled is operated in the following manner. If one of the key buttons 14 is pushed, the push portion 26c presses down the circuit board 16, so that the movable contact 19 on the other surface 16b enters the recess 12a of the lower case 12 to touch the fixed contact 27. Accordingly, a timing signal delivered from the LSI 15 is transmitted from one line patterns of the movable contact 19 to the other through the fixed contact 27. Thus, a specified key signal is applied to the input of the LSI 15. When the key button 14 is released, the protruding portion 26a of the elastic sheet 26 is restored to its original position by its own elastic force. At the same time, the flexible circuit board 16 moves up to resume its original plate form, so that the movable contact 19 is separated from the fixed contact 27. While the circuit board 16 is restored in this manner, the air pressure inside the recess 12a of the lower case 12 possibly becomes negative and makes the return of the wiring substrate 16 unreliable. In this embodiment, however, air from the grooves 12e connecting with other recesses flows into the recess 12a to prevent the production of negative pressure, so that the return of the circuit board 16 is quickly accomplished with high reliability.

In the above embodiment, the key buttons 14 are made of the same material as the elastic sheet 26. Alternatively, however, they may be made of synthetic resin or be bonded to or formed integrally with the elastic sheet 26. The shape of the key buttons 14 is not limited to the rectangular shape. For example, the key buttons 14 may also assume square, circular or any other suitable configuration. Also, the protruding portion 26a may be formed into various other shapes. For example, the protruding portion 26a may take the same shape as the key button 14. In this case, the head portion 26b connecting the key button 14 and the protruding portion 26a may be omitted. Although the circuit board 16 is of a both surface printed type in the above embodiment, the circuit patterns may be arranged only on the surface on which movable contacts are formed.

Figure 11:
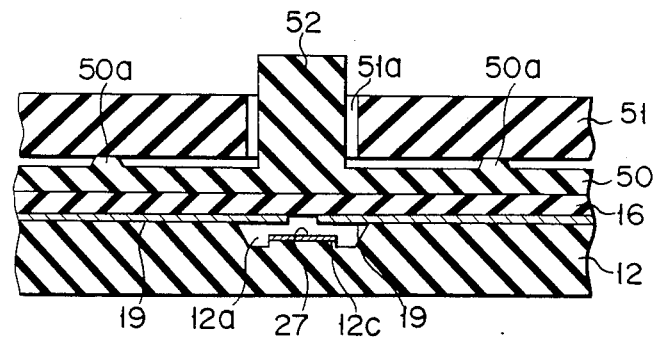
FIG. 11 is a sectional view showing another embodiment of the invention.

FIG. 11 shows another embodiment of the keyswitch structure of the present invention. In this second embodiments, like reference numerals are used to designate like portions included in the first embodiment, and a detailed description of those portions is omitted. In the second embodiment, an elastic sheet 50 and an upper case 51 are different in shape from their counterparts in the first embodiment. The elastic sheet 50 has no protruding portion, and the upper case 51 is not provided with the support portions. Therefore, the structure is further thinned as a whole. Practically, in the second embodiment, the thickness of the keyswitch structure consists of the thicknesses of the elastic sheet 50 and the circuit board 16 plus those of the upper and lower cases 51 and 12. This simple structure can fulfill the same functions of the first embodiment. Although the elastic sheet 50 has neither the protruding portion nor the push portion, a thick key button 52 protruding directly from the elastic sheet 50 to the outside through a button hole 51a of the upper case 51 can fulfill the functions of those two omitted members. The automatic returning force is provided by the elastic force of the elastic sheet 50, and the function of the push portion is covered by making the width of the key button 52 smaller than that of the recess 12a of the lower case 12 and greater than that of the fixed contact 27. The support portions of the upper case are replaced with small projections 50a formed integrally on the elastic sheet 50. If the upper case 51 is held against the lower case 12 so as to squeeze the projections 50a, the elastic sheet 50 and the wiring substrate 16 thereunder can be immovably held between the upper and lower cases 51 and 12.

In the structure described above, the circuit board and the elastic sheet are held under pressure between the upper and lower cases. Alternatively, however, both the circuit board and the elastic sheet may be bonded to the lower case. In this case, the upper case may be omitted. Moreover, the elastic sheet may be formed of a resin film, such as polyvinyl chloride, polyester, etc. In this case, the key indication may be printed on the film for a thinner structure.

Thus, the keyswitch structure according to the present invention comprises an elastic sheet having push portions, a flexible circuit board having movable contacts corresponding to the push portions, and a case having recesses corresponding to the movable contacts and fixed contacts in the recesses. Thus, the case serves both as a spacer and fixed contacts. Constructed in this manner, the keyswitch structure of the invention may be applied to any other electronic apparatus than the compact electronic computers.

According to the keyswitch structure of the invention, as described above, the number of components required is reduced and the production efficiency is improved. In particular, the reduction of the sheetlike components in number facilitates automatic assembly, permitting a substantial reduction in cost. Moreover, the apparatus using the keyswitch structure may be further thinned.

What is claimed is:

1. A keyswitch structure comprising:
   an elastic sheet member having a plurality of operation portions adapted to be pushed by an operator and being capable of elastic deformation responsive to pushing;
   a flexible circuit board adjacent to said elastic sheet member, said flexible circuit board having first conductive wiring patterns and first and second movable contacts which are opposite to said elastic sheet member and which are close to each other at each of said operation portions, said flexible circuit board being pushable by said elastic sheet member to be depressed together with said first and second movable contacts thereof when said elastic sheet member is pushed;
   a lower case carrying said elastic sheet member and flexible circuit board with said flexible circuit board interposed between said elastic sheet member and said lower case, said lower case having recesses which are respectively opposite to the operation portions of said elastic sheet member;
   dot-like fixed contacts each formed on surfaces of said recesses which face said movable contacts and electrically connecting said first and second movable contacts of said flexible circuit board when said operation portions of said elastic sheet member are pushed to depress said flexible circuit board; and
   fixing means for firmly fixing together said elastic sheet member, flexible circuit board, and lower case.

2. The keyswitch structure of claim 1, wherein said flexible circuit board has a through hole therein, and second conductive wiring patterns on a side thereof opposite said first wiring patterns, said second wiring patterns being connected to said first wiring patterns by said through hole, said second wiring patterns being on a surface opposite to a surface on which said first and second movable contacts are formed.

3. The keyswitch structure of claim 2, wherein said first and second movable contacts, and said conductive patterns are formed by conductive ink.

4. The keyswitch structure of claim 3, wherein said conductive patterns are made of a metal layer of good conductivity formed in a conductive ink layer on the inner side thereof.

5. The keyswitch structure of claim 4, wherein said through hole is formed by a laser beam; and said conductive patterns, and first and second contacts are connected by said conductive ink forming said first and second contacts and which fills said through hole.

6. The keyswitch structure of claim 1, further comprising a cover on said elastic sheet member, said elastic sheet member and said flexible circuit board being fixed between said lower case and said cover.

7. The keyswitch structure of claim 1 wherein said fixing means includes an adhesive agent.

8. The keyswitch structure of claim 1, wherein said lower case comprise a plurality of grooves therein which communicate with said recesses, so that air in said recesses escapes through said grooves when each of the operation portions is pushed to deform the elastic sheet member.

9. The keyswitch structure according to claim 1, wherein said fixed contacts are formed by hot stamping.

10. The keyswitch structure according to claim 9, wherein said lower case has projections formed inside said recesses and bearing said fixed contacts thereon.

* * * * *